INVENTORS:
RAYMOND G. OLSSON,
EARL C. WILLIAMS,

BY Robert J. Mooney
THEIR ATTORNEY.

INVENTORS:
RAYMOND G. OLSSON,
EARL C. WILLIAMS,
BY Robert J. Mooney
THEIR ATTORNEY.

United States Patent Office 3,438,668 Patented Apr. 15, 1969

3,438,668
CONTACTLESS LIFTER

Raymond G. Olsson, Jamesville, and Earl C. Williams, Syracuse, N.Y., assignors to General Electric Company, a corporation of New York Filed Aug. 26, 1965, Ser. No. 482,810
Int. Cl. B66c 1/02; A47b 97/00; F16k 31/00
U.S. Cl. 294—64 6 Claims This invention relates to a device for picking up objects without making physical contact with the objects and, more specifically, this invention relates to a device for picking up elements by utilizing a flow of gaseous medium, such as air.

There are many applications in which it is desired to pick up an object without having it contacted by either the fingers or mechanical extensions of fingers, such as prongs or tweezers or the like. The reasons for desiring such a contactless pick-up are that the handling of the object may cause deleterious effects upon the material of the object, such as marring or contamination of the surface thereof, or that the object may be quite fragile and any such contact would produce undesirable fracturing. For example, semiconductor wafers from which semiconductor devices such as diodes or transistors are formed are particularly susceptible to damage from mechanical contact during handling, due to extreme thinness of the wafer with respect to its diameter and the importance of preventing flaws in the monocrystalline material of the wafer. Even prior art devices that use other principles than mechanical gripping, for example suction pick-up, mar or fracture an undesirable number of the semiconductor wafers upon contact of the wafer with the pick-up head. The undesirable elements of these prior art methods are overcome by the present invention, which utilizes a flow of a gas to produce the pick-up force and which utilizes the same gas flow to prevent any damaging contact between the wafer and the pick-up apparatus.

Therefore, it is a primary object of this invention to provide a device which will pick up delicate objects without any contact between the pick-up device and the object being picked up.

Another object of this invention is to provide a pick-up device that utilizes a flow of a gas such as air to provide the pick-up force and to provide a cushion between the object being picked up and the pick-up device.

Yet another object of this invention is to provide a pick-up device that utilizes the Bernoulli principle.

Briefly, this invention involves a device constructed to utilize the pressure-velocity relationship expressed in the Bernoulli principle to achieve a desired pick-up action. In one form thereof, a pick-up head is constructed with a gas-flow boundary surface arranged to be disposed adjacent the object that is to be picked up, such as a wafer of semiconductor material. An opening is formed in the middle of the flow boundary surface, out of which is caused to flow a gaseous medium, such as air. Optionally, an air deflecting means is positioned in the opening in the surface, the air deflecting means being formed so as to force the air outwardly from the opening along the flow boundary surface of the pick-up head. The velocity of the air flow is increased as it leaves the opening and consequently the pressure adjacent the flow boundary surface will be decreased, so that if the flow boundary surface is placed near a complementary surface of an object to be picked up, normal atmospheric pressure will be sufficient to cause the object to be moved toward the flow boundary surface and thereby picked up. At the same time, the flowing air provides a cushion to prevent injurious contact of the object being picked up with the flat surface of the pick-up head. Alternatively, the air deflector may be omitted, the object to be picked up itself serving to deflect the flowing air parallel to the flow boundary surface.

Other objects and further details of this invention will be apparent from the following description and claims taken with the accompanying drawings in which:

Figure 1:
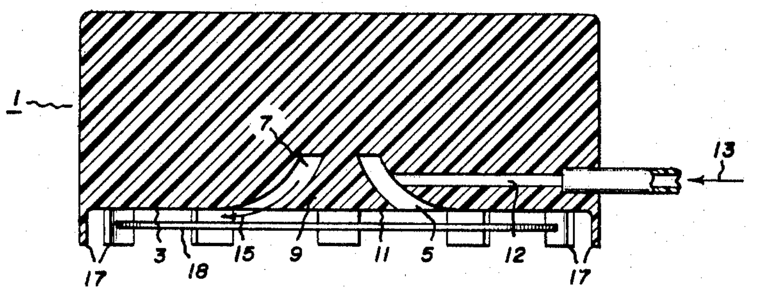
FIGURE 1 is a side elevational view partially in section of one form of pick-up device of the type contemplated in this invention.

Referring now to FIGURE 1, a portion of a pick-up device having a pick-up head 1 is illustrated. Pick-up head 1 has a flat flow boundary surface 3 provided with a central opening 5. The opening 5 is the large end of a bell-shaped cavity 7. Coaxially disposed in, and spaced from the walls of, cavity 7 is a plug 9 integral with head 1 and which is positioned with a wide flared portion 11 situated slightly outside opening 5.

Figure 2:
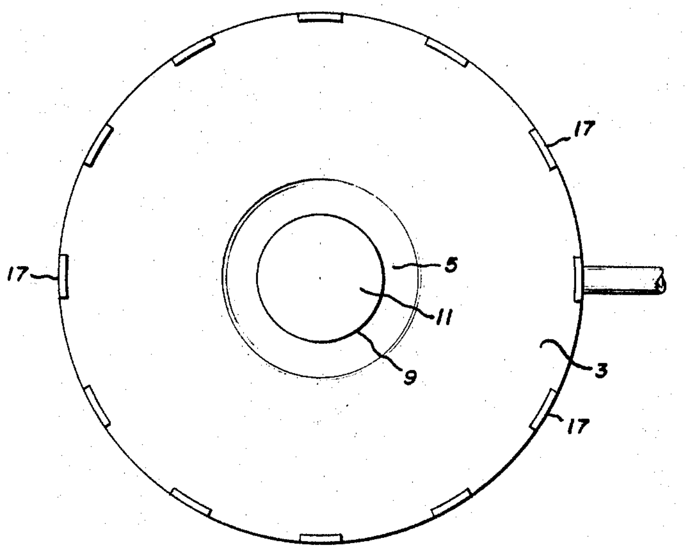
FIGURE 2 is a bottom view of the device illustrated in FIGURE 1.

A duct 12 carries a gaseous medium such as air in a direction indicated by arrow 13. The air in duct 12 passes into the cavity 7 where it is directed by plug 9 outwardly along surface 3 of the pick-up head in the direction indicated by arrow 15. Projections 17 are placed along the perimeter of the flat surface 3 in order to prevent an object being picked up from being displaced laterally across the flat surface by the flowing air. In FIGURE 2, the positioning of the projections 17 about the perimeter of the surface 3 is illustrated. FIGURE 2 also indicates the position of the flared portion 11 of plug 9 in the opening 5.

In operation, an object such as semiconductor wafer 18 is picked up as a result of the application of Bernoulli's theorem. Bernoulli's theorem may be stated:

$$p/\rho+gz+\frac{v^2}{2}=H$$

where $p$ is pressure, $\rho$ is mass density of the fluid, $g$ is the acceleration due to gravity, $z$ is vertical height, $v$ is velocity, and H is a constant. Assuming that the mass density $\rho$ and the potential energy given by the expression $gz$ are constant, Bernoulli's equation shows that the pressure decreases by an amount equal to half the increase in the velocity squared. Thus, in the device shown in FIGURE 1, as the velocity in the air is increased in the direction shown by arrow 15 when the flow boundary surface 3 is placed near a complementary surface of an object, such as a wafer, to be picked up, a low pressure region is formed between the flow boundary surface 3 of the pick-up head 1 and the object, with the result that the object will be urged by atmospheric pressure into the low pressure region, and thus lifted toward the pick-up head 1. The velocity of the air issuing from the opening 5 may be varied by shaping confronting portions of the plug 9 and cavity 7 appropriately, as for instance causing them to converge. As an object such as a wafer is picked up from the surface on which it is resting, the air flowing from opening 5 prevents the wafer from striking against the plug 9 or the flat surface 3 and thus provides a "cushion" for the wafer. The projections 17 then prevent the wafer from being moved laterally off the surface 3 by the force of the air flowing in the direction indicated by arrow 15. To preclude damage to the wafer, projections 17 may be made of a soft resilient material. Even though the wafer is always cushioned by the air from contact with surface 3, if it becomes laterally displaced sufficient to contact projections 17, such contact will prevent rotary motion of the wafer, thus preserving rotational orientation of the wafer as desired. The contact of the edge of the wafer with the projections 17 is not such as to cause any damage and is not a necessary step in all applications.

Figure 3:
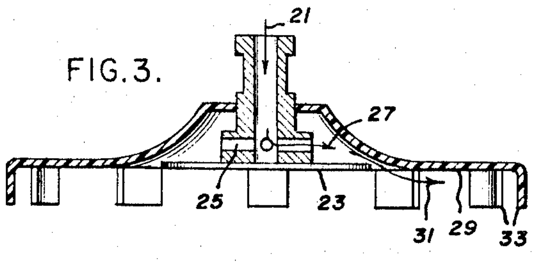
FIGURE 3 is a side view of another embodiment of the pick-up device constructed according to the invention.
Figure 4:
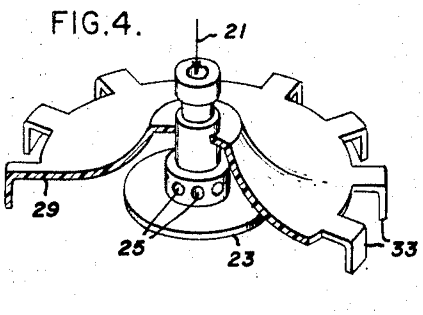
FIGURE 4 is a perspective view of the device illustrated in FIGURE 3.

Referring now to FIGURES 3 and 4, a modification of the pick-up device of FIGURE 1 is illustrated. In this embodiment the gas (air) comes from the top as illustrated by arrow 21 and strikes against a plate 23, which functions as does the flared portion 11 of plug 9 in FIGURE 1. The air, or other gas, then escapes through ducts 25, as illustrated by arrow 27. The plate or flange 23 then directs the air along flat flow boundary surface 29 of the device, as illustrated by arrow 31. Projections 33, equivalent to projections 17 in FIGURES 1 and 2, are constructed to prevent lateral movement of the object being picked up. It is desirable to form the projections 33, like projections 17 in the previous embodiment, of some material which will not damage the wafer as it may move laterally across the surface 29. In fact, such a soft plastic makes a desirable material for the surface 29 as well as for projections 33.

Figure 5:
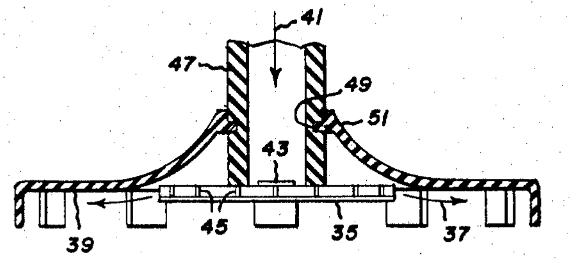
FIGURE 5 is a side view of yet another embodiment of the pick-up device constructed according to the invention.
Figure 6:
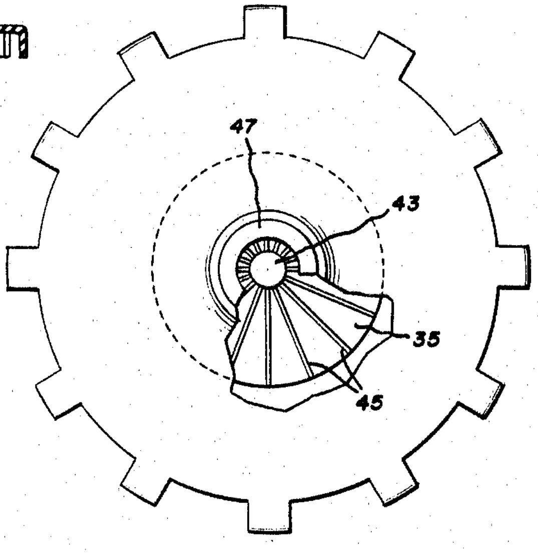
FIGURE 6 is a top view of the pick-up device illustrated in FIGURE 5.

Yet another embodiment of the device is illustrated in FIGURES 5 and 6. In this embodiment a flange or deflector plate 35 directs the air or other flow gas in the direction shown by arrow 37 along flat boundary surface 39 of the pick-up head. For this operation, air enters the device, as shown by arrow 41, and strikes against the plate 43 located slightly above the flange 35. Radiating outwardly from the perimeter of plate 43 to the perimeter of flange 35 at a height equal to the distance between the plate and the flange are a series of vanes 45. These vanes break the air into a number of radial paths, as indicated by arrow 37. Deflector plate 35 is spaced slightly below surface 39, and thus provides a stop against which an object lifted by the pick-up head of FIGURE 5 is drawn. This stop is particularly useful in steadying such a lifted object if it be desired to immerse the lower portion of the lifted object in a bath, such as for example a cleaning or etching solution, while it is being carried by the pick-up head.

The duct passing the air, as shown by arrow 41, may be formed by a rubber tube 47. The tube 47 has a neck formed so as to snap into coupling relation with an annular projection 51 formed in the pick-up head. This arrangement permits a solid seating of the tube within the head and also provides an air-tight seal for air introduced in the rubber tube 47.

Figure 7:
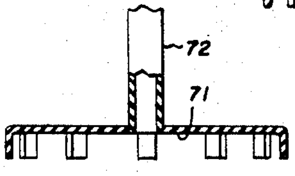
FIGURE 7 is a side elevational partly sectionalized view to a diminished scale of an alternative embodiment of a pick-up device constructed according to the invention.

FIGURE 7 shows an alternative embodiment of a pick-up device in which no central deflector, such as deflector 9 of FIGURE 1, is used. Rather, the complementary surface of the object to be picked up, when brought into proximity with the flow boundary surface 71, causes the air issuing from tube 72 to be deflected parallel to surface 71 so as to produce the reduced pressure desired for effective lifting action.

Figure 8:
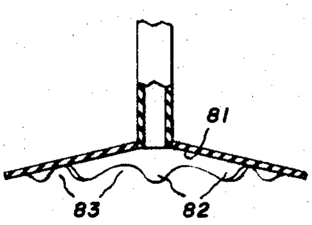
FIGURE 8 is a side elevational partly sectionalized view to a diminished scale of an alternative embodiment of a pick-up device constructed according to the invention.

In the alternative embodiment of FIGURE 8, the flow boundary surface 81 is made slightly conical so as to provide for contact of the pick-up device with the periphery of the wafer or other object lifted thereby. The marginal portion of the flow boundary surface 81 is scalloped to provide fingers 82 for restraining a wafer lifted thereby against lateral movement, and the notches 83 between the fingers 82 permit outflow of air from between the flow boundary surface 81 and an object supported thereby.

Figure 9:
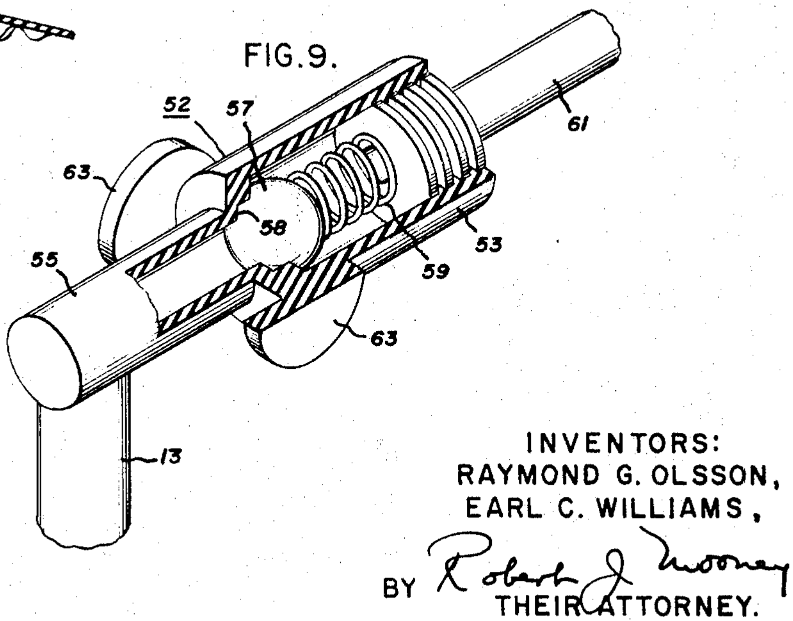
FIGURE 9 is a perspective view of a particular type of valve which may be utilized in conjunction with any of the pick-up devices illustrated in FIGURES 1 through 8.

A combination handle for manipulating the pick-up head and valve for conveniently controlling the air flowing in rubber tube 47 in FIGURE 5, for example, is shown at 52 in FIGURE 9. This valve includes a first portion 53 of a larger diameter and a smaller diameter portion 55. A ball 57 having a diameter greater than the diameter of the small diameter portion is located in the large diameter portion 53. The ball 57 is forced against a shoulder 58 of the portion 55 by a spring 59, thus sealing the opening of the smaller diameter portion 55. The spring pressure plus the pressure of the air entering through a tubular portion 61 is sufficient to provide an air-tight seal at the entrance to the small diameter portion 55. A pair of circular grips 63 are provided on either side of the portions 53 and 55 and are secured thereto so that when a force is applied to grips 63, it is transmitted to both portions 53 and 55. When it is desired to initiate a pick-up action, the grips 63 are pressed together so that the portions 53 and 55 are deformed, forcing the ball 57 away from the shoulder 58 and allowing air to flow into ducts 13, 21, or 41 of the different embodiments. With the same hand that holds valve assembly 52 as a handle for manipulating the pick-up head attached to hose 13, the operator can conveniently control the amount of air flow, and hence vary the lifting force of the pickup head pressure by varying the pressure on control portions 63.

It will be appreciated by those skilled in the art that the invention may be carried out in various ways and may take various forms and embodiments other than the illustrative embodiments heretofore described. Accordingly, it is to be understood that the scope of the invention is not limited by the details of the foregoing description.

What we claim as new and desire to secure by Letters Patent of the United States is:

1. A wafer pick-up device comprising a pick-up head having a flow boundary surface, an opening in said surface, a duct for conveying air connected to said opening, valve means for controlling the flow of air in said duct, means for directing the air flowing through said opening between said surface and the wafer to be picked up to produce a low pressure region between said surface and the wafer, the flowing air in said low pressure region serving as a buffer preventing contact between the wafer and said surface, and projections formed on the perimeter of said surface, said projections extending perpendicular to the direction of air flow in said low pressure region and engageable with the edge of the wafer to prevent said wafer from moving in a direction parallel to said surface.

2. A wafer pick-up device as recited in claim 1 wherein said valve means comprises a deformable tube having a first large diameter portion and a second smaller diameter portion, a spring loaded ball located in said first portion, said ball having a diameter greater than the diameter of the second portion of said deformable tube and normally blocking the passage to said second portion, and a manual control located at the juncture of said first and second portions, whereby operation of said control deforms said tube and permits flow of air around said ball.

3. A wafer pick-up device comprising a pick-up head having a flat surface, an opening in said surface being the open portion of a bell-shaped portion of said pick-up head, a duct for conveying air to said opening, valve means for controlling the flow of air in said duct, a plug shaped to fit within said bell-shaped portion and having a wide flange portion at said opening, said flange portion directing the air flowing through said opening between said surface and the wafer to be picked up to produce a low pressure region between said surface and the wafer, the flowing air providing a buffer preventing contact between the wafer and the surface and projections formed on the perimeter of said surface and extending normal to the path of air flow in said low pressure region to prevent said wafer from moving in a direction parallel to said surface.

4. A wafer pick-up device as recited in claim 3 wherein said duct terminates in an open central portion of said plug, a plurality of passages formed through said plug to permit the flow of air from said central portion of said plug parallel to said surface.

5. A wafer pick-up device as recited in claim 3 wherein said duct terminates in an open central portion of said plug, vanes are positioned on said flange portion to form air passages through which the air flow is directed parallel to said surface.

6. In a pressure pick-up device for lifting and holding an article having a planar surface, a head having a passageway therethrough terminating in a flat surface on said head, means for impressing pressurized fluid through said passageway with sufficient velocity to impinge upon a planar surface of an article to form a layer of flowing fluid across said surfaces to produce a static pressure head between said surfaces which is less than atmospheric pressure and which lifts and holds said article suspended on said layer of said flowing fluid at a distance from said flat surface, and means projecting from said flat surface for contacting the edge of said article to limit lateral movement of said article relative to said flat surface, said projecting means being radially spaced from said passageway a sufficient distance to accommodate the article and being spaced from each other a distance to preclude passage of the article between any two adjacent projecting means.

References Cited

UNITED STATES PATENTS 2,999,499 9/1961 Willet ____________ 251—342 X

FOREIGN PATENTS 944,175 12/1963 Great Britain.

GERALD M. FORLENZA, *Primary Examiner.*

G. F. ABRAHAM, *Assistant Examiner.*

U.S. Cl. X.R.

251—342; 271—74

U.S. DEPARTMENT OF COMMERCE
PATENT OFFICE
Washington, D.C. 20231

UNITED STATES PATENT OFFICE

CERTIFICATE OF CORRECTION

Patent No. 3,438,668 April 15, 1969

Raymond G. Olsson et al.

It is certified that error appears in the above identified patent and that said Letters Patent are hereby corrected as shown below:

Column 3, line 39, after "flat" insert -- flow --.

Signed and sealed this 14th day of April 1970.

(SEAL)
Attest:

Edward M. Fletcher, Jr.
Attesting Officer

WILLIAM E. SCHUYLER, JR.
Commissioner of Patents